(12) United States Patent
Butler et al.

(10) Patent No.: US 6,912,041 B2
(45) Date of Patent: Jun. 28, 2005

(54) LITHOGRAPHIC APPARATUS AND METHOD

(75) Inventors: Hans Butler, Best (NL); Thijs Rein Verbeek, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/183,027

(22) Filed: Jun. 27, 2002

(65) Prior Publication Data

US 2003/0053035 A1 Mar. 20, 2003

(30) Foreign Application Priority Data

Jun. 29, 2001 (EP) .............................................. 01202520

(51) Int. Cl.$^7$ ........................ G03B 27/42; G03B 27/32; G01B 11/00
(52) U.S. Cl. ............................. 355/53; 355/77; 356/401
(58) Field of Search ............................. 355/53, 55, 72, 355/77, 67; 356/399, 400, 401; 248/550, 638; 318/687

(56) References Cited

U.S. PATENT DOCUMENTS

| | | | |
|---|---|---|---|
| 5,187,519 A | | 2/1993 | Takabayashi et al. |
| 5,726,879 A | | 3/1998 | Sato |
| 6,036,162 A | * | 3/2000 | Hayashi ...................... 248/550 |
| 6,297,876 B1 | * | 10/2001 | Bornebroek ................. 355/67 |
| 6,359,688 B2 | * | 3/2002 | Akimoto et al. ............. 356/401 |
| 6,417,922 B1 | * | 7/2002 | Dirksen et al. ............. 356/401 |
| 6,512,641 B2 | * | 1/2003 | Omura ........................ 359/727 |
| 2001/0038500 A1 | * | 11/2001 | Shibazaki ................... 359/823 |

FOREIGN PATENT DOCUMENTS

EP   1 041 607   10/2000

OTHER PUBLICATIONS

Tsai and Yen, "Servo System Design of a High–Resolution Piezo–Driven Fine Stage for Step–and–Repeat Microlithography Systems," IECON '99 Proceedings, pp. 11–16, Nov. 29, 1999.

Kouichi et al., "Large scale active microvibration control system using piezoelectric actuators applied to semiconductor manufacturing equipment," Abstract No. XP–002186461, Nov. 1997.

A copy of the European Search Report dated Jan. 18, 2002, issued in the corresponding European Application No. 01202520.1.

Kouichi Kajiwara et al., "Large scale active microvibration control system using piezoelectric actuators applied to semiconductor manufacturing equipment," Nippon Kikai Gakkai Ronbunshu, C Hen/Transactions of the Japan Society of Mechanical Engineers, vol. 63, No. 615, pp. 3735–3742 (Nov. 1997).

\* cited by examiner

*Primary Examiner*—Peter B. Kim
(74) *Attorney, Agent, or Firm*—Pillsbury Winthrop Shaw Pittman LLP

(57) ABSTRACT

A lithographic apparatus according to one embodiment of the invention includes a movement detector configured to detect movement of the projection system and to generate a movement signal; a controller responsive to the movement signal and configured to generate a control signal; and an actuator assembly responsive to the control signal and configured to reduce movement of the projection system.

36 Claims, 15 Drawing Sheets

LITHOGRAPHIC APPARATUS AND METHOD

This application claims priority to EP 01202520.1 filed Jun. 29, 2001, which document is herein incorporated by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. Generally, such a pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and No. 5,523,193, which are incorporated herein by reference, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a whole network of adjacent target portions that are successively irradiated via the projection system (e.g. one at a time). Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens". The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin-stage lithographic apparatus are described, for example, in U.S. Pat. No. 5,969,441 and WO 98/40791, incorporated herein by reference.

In lithography it is important to accurately project the patterned beam onto a target portion of the substrate. As said, the patterned beam is obtained by imaging the incoming projection beam through a pattern on the mask. One of the problems that may occur during said imaging is fading. Fading is characterized by a low contrast of boundaries of features projected from the mask onto the substrate. It is desirable to reduce causes of fading and to obtain a more accurate projection.

SUMMARY

Embodiments of the invention include a lithographic apparatus capable of reducing vibrational movement of the projection lens.

A lithographic apparatus according to one embodiment of the invention includes a movement detector configured to detect movement of the projection system and to generate a movement signal; a controller responsive to the movement signal and configured to generate a control signal; and an actuator assembly responsive to the control signal and configured to reduce movement of the projection system.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
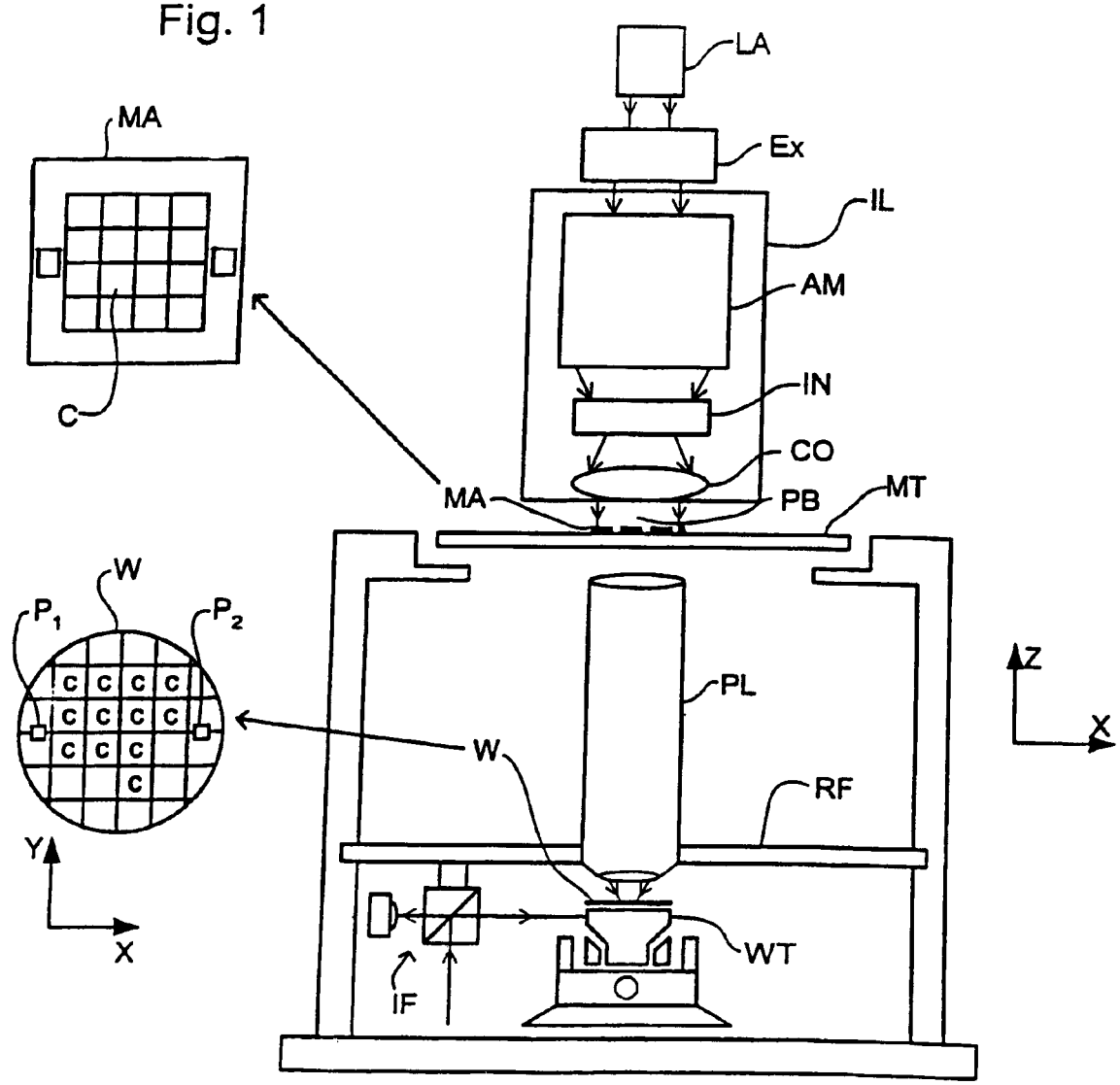
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated silicon wafer), and is connected to a second positioning structure for accurately positioning the substrate with respect to item PL; and A projection system ("lens") configured to project the patterned beam. In this example, projection system PL (e.g. reflective, a refractive or a catadioptric lens design) is configured to image an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a mercury lamp, an excimer laser, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as a-outer and a-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Vibrational movement—in particular, of the projection lens relative to the mask—may result in fading. Such vibrational movement may be caused by resonances in the lithographic projection apparatus, e.g. eigenfrequencies of the projection lens or some other element in the apparatus, acoustics introduced by gas supplies, or movement of the mask or substrate table. These different contributions to the vibrational movement of the projection lens may result in a complex array of movements that contribute to the above-described fading problem.

The projection lens PL may be mounted on a reference frame RF or main plate. In such an arrangement, the vibrational movement of the lenstop of the lens PL (which is closest to the mask table MT) may be difficult to control, as the distance of the lenstop with respect to the reference frame RF may be relatively large (e.g. 1 meter). A lithographic apparatus according to an embodiment of the invention includes a movement detector, a controller, and an actuator assembly that is configured to compensate the vibrational movement of the lens PL. The movement detector is configured to detect movement of the projection system and to generate a movement signal based on the detected movement. For example, the movement detector may measure vibrational movement of the projection system. Such a movement detector may be connected to the lens PL (e.g. at the top of the lens PL) or may sense movement of the projection system without being connected to it (e.g. as in certain capacitive, inductive, and/or optical arrangements). The movement detector may be implemented as one or more acceleration measuring devices such as accelerometers, with one or more velocity measuring devices (e.g. geophones), or with one or more displacement measuring devices (e.g. piezo-based devices).

In the embodiments described below, the lenstop vibrational movement is determined by using two accelerometers capable of measuring accelerations in two orthogonal directions i.e. the X and Y direction. In a step-and-scan apparatus, the Y-direction generally coincides with the scanning direction. After measuring accelerations in the X- and Y-direction, the accelerometers generate a movement signal.

The controller, in turn, is configured to generate a control signal in response to the movement signal. The actuator assembly is configured to affect, in response to the control signal, the movement of the projection system. For example, the actuator assembly may reduce vibrational movement of the lens PL.

One example of such an actuator assembly includes an air mount (not depicted) connected to the reference frame. Example of such pneumatic air mounts can be gleaned from European Patent Publication 0973067, which is incorporated herein by reference. The air mount may also comprise actuators based on magnetic principles such as a Lorentz-force motor, for example. Alternatively, the actuator assembly may be positioned between the projection lens PL and the reference frame RF. This actuator assembly is capable of moving the projection lens relative to the frame RF and may comprise piezo (e.g. piezoelectric) elements. An example of such an actuator assembly can be gleaned from co-pending unpublished European Patent Application 01300479.1, which is incorporated herein by reference.

The inventors have discovered that vibrational movements with frequencies between 50 and 110 Hz largely contribute to fading. In cooperation with the movement detector and controller, the actuator assembly is capable of actively damping the vibrational movements of the projection lens, thereby decreasing the characteristics of fading. This effect is achieved by detecting the vibrational movement of the projection lens with the movement detector. The movement detector generates a movement signal to which the controller is responsive. The controller in turn generates in a feedback loop a control signal. The actuator assembly responds to the control signal and actively damps the vibrational movements of the lens. In this way, the accuracy with which features of the mask pattern are projected onto a target portion of the substrate is increased, as well as the contrast of boundaries of projected features on the substrate.

In one embodiment, the controller generates the control signal using an algorithm based on the H infinity method (hereafter referred to as the H∞method). The H∞method, which will be further explained below, provides a good damping performance and a high robustness.

In the following, some examples of controllers will be described in more detail. As in a step-and-scan apparatus movement of the mask and/or substrate table may contribute largely to the vibrational movement of the lenstop, the below embodiments particularly describe the vibrational movements in a step-and-scan apparatus. However, the invention is not limited to the step-and-scan apparatus as it can also be applied to a wafer stepper, for example.

A controller is developed for damping of lenstop vibrations, which employs the H∞control design method. General information about the H∞method can be gleaned from a publicly available manuscript by A. A. H. Damen and S. Weiland ('Robust Control', Eindhoven University of Technology, 1999), which is incorporated herein by reference. Some important aspects of the H∞design method concerning the use of the method for the problem of damping lenstop acceleration are pointed out here:

(1) The H∞design method is well capable to handle MIMO (multiple input multiple output) systems as well as SISO (single input single output) systems;

(2) The H∞design method is frequency oriented. This is a great advantage as all the required information is available in the frequency domain;

(3) The H∞design method can guarantee robustness.

The critical part of H∞design is to determine an augmented plant comprising a weighted filter. After choosing initial filters, some tuning is needed to obtain the preferable performance. For the choice of which weighting filters will be used, two aspects must be taken into account: (1) performance and (2) model uncertainty.

Sensor noise is neglected again, and no direct penalty will be put on actuation. Furthermore there is no reference signal present, there is only disturbance that has to be damped.

Figure 2:
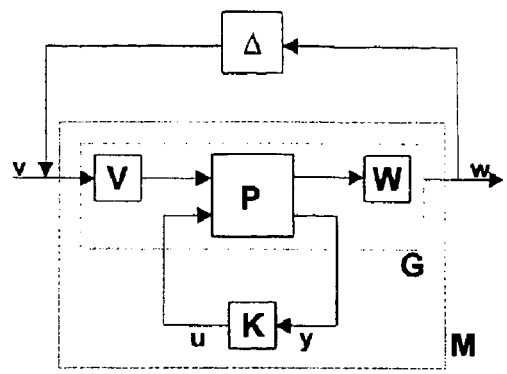
FIG. 2 depicts a first control loop according to an embodiment of the invention.

There are three augmented plant setups, resulting from three different control structures (i.e. three different weighting filter combinations) that will be discussed. The standard control system set-up can be seen in FIG. 2. In this figure P denotes the physical standard plant, G is the generalized standard plant including the weighting filters V and W to specify performance, and M is the augmented plant, the weighted closed-loop system. Each different augmented plant setup results in a different minimizing problem. The weighting filters generally comprise two parts: a scaling filter and a weighting filter for loopshaping. Different scaling for the inputs and outputs can be omitted. This is a consequence of the mutual similarity of the actuators and sensors. Furthermore, the mutual similarity of the sensors and actuators together with equal performance demands for the X and Y direction of the controlled system, result in the use of diagonal weighting filters. So, with every mentioned filter, a [2,2] transfer function matrix is meant, with the filter on the (1,1) and (2,2) position (the other elements of the matrix are zero), unless stated otherwise. Another remark is that phase data of filters will not be plotted, because the H∞method is phase independent.

It is preferable to keep the composed matrix, resulting from the augmented plant, as small as possible. Therefore a filter $W_u$ on the actuation signal is employed to account for model uncertainty. This is possible, because the filter is not used for restricting actuation. In combination with a disturbance input filter $V_d$, the model uncertainty $\Delta P$ can be modeled. The above-described control structure with the weighting filters is shown in FIG. 3.

The filter $W_e$ is the filter that penalizes the output signal and thus specifies performance requirements.

Figure 3:
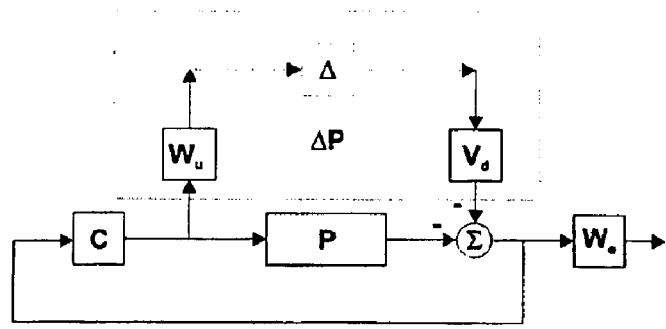
FIG. 3 depicts a second control loop according to an embodiment of the invention.

With the setup of the augmented plant from FIG. 3, the H∞design control method results in the so-called mixed sensitivity problem, the design of a controller that minimizes:

$$\|M\|_\infty = \left\|\begin{pmatrix} W_e S V_d \\ W_u R V_d \end{pmatrix}\right\|_\infty$$

It holds that $$W_{et} \cdot S \cdot V_{dt} = \begin{bmatrix} W_e & 0 \\ 0 & W_e \end{bmatrix} \cdot \begin{bmatrix} S_{11} & S_{12} \\ S_{21} & S_{22} \end{bmatrix} \cdot \begin{bmatrix} V_d & 0 \\ 0 & V_d \end{bmatrix} \Rightarrow$$

$$\bar{\sigma}(W_{et} \cdot S \cdot V_{dt}) < \gamma \Leftrightarrow |W_e| \cdot \bar{\sigma}(S) \cdot |V_d| < \gamma \Leftrightarrow \bar{\sigma}(S) < \frac{\gamma}{|W_e V_d|}$$

-continued equivalently:

$$\left.\begin{array}{l}\overline{\sigma}(W_{ut}\cdot R\cdot V_{dt})<\gamma \Leftrightarrow |W_u|\cdot \overline{\sigma}(R)\cdot |V_d|<\gamma \Leftrightarrow |W_u|\cdot \overline{\sigma}(P^{-1}T)\cdot |V_d|<\gamma \\ \overline{\sigma}(P^{-1}T)\geq \underline{\sigma}(P^{-1})\cdot \overline{\sigma}(T)\end{array}\right\} \Rightarrow$$

$$|W_u|\cdot \underline{\sigma}(P^{-1})\cdot \overline{\sigma}(T)\cdot |V_d|<\gamma \Leftrightarrow \overline{\sigma}(T)<\frac{\gamma}{|W_uV_d|\cdot \underline{\sigma}(P^{-1})}\Leftrightarrow \overline{\sigma}(T)<\frac{\gamma \cdot \overline{\sigma}(P)}{|W_uV_d|}$$

Preferably $\|M\|\infty<\gamma\approx 1$, which consequently in the mixed sensitivity problem leads to the following restrictions in the mixed sensitivity problem:

$$\forall \omega: \overline{\sigma}(S)<\frac{1}{|W_eV_d|}$$

$$\forall \omega: \overline{\sigma}(T)<\frac{\overline{\sigma}(P)}{|W_uV_d|}$$

These restrictions can easily be plotted and bottlenecks can easily be recognized, which helps with the choice of weighting filters.

Model uncertainty can best be modeled as additive model uncertainty when using the control structure of FIG. 3. In this case, as a result of the small gain theorem, robust stability is guaranteed if:

$$\|M\|\infty<\gamma\approx 1 \text{ and } \forall \omega: \overline{\sigma}(\Delta P)<|W_uV_p|$$

wherein ΔP represents the additive model error. In this case, the filter $V_d$ is represented by $V_p$.

Figure 4:
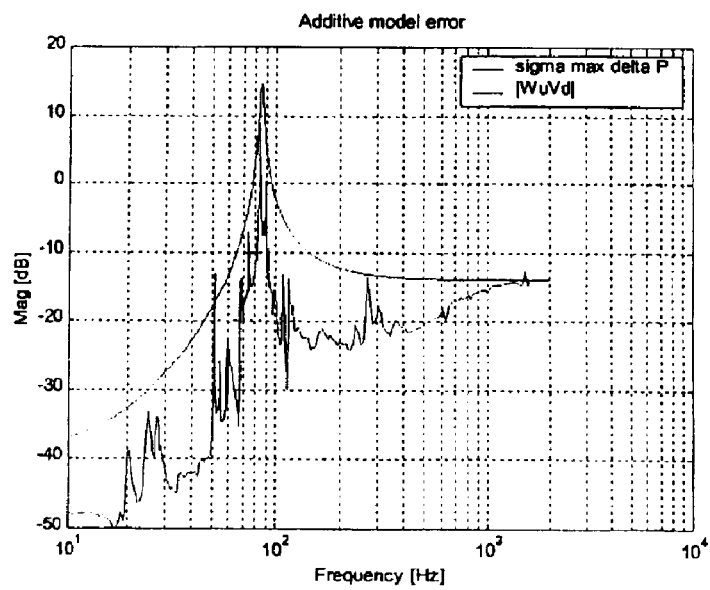
FIG. 4 depicts an additive model error plot according to an aspect of the invention.

It is a great problem to guarantee robustness for damping lenstop acceleration, as there exists a harsh trade-off between robustness and performance. FIG. 4 shows the maximum singular values of the additive model error. This error was determined by subtracting the modeled frequency response functions from the measured frequency response functions. FIG. 4 also shows a possible combination $|W_uV_d|$ where applies:

$$\forall \omega: \overline{\sigma}(\Delta P)<|W_uV_p|$$

To guarantee robust stability, the goal was $\|M\|\infty<\gamma\approx 1$, which was shown to imply:

$$\forall \omega: \overline{\sigma}(T)<\frac{\overline{\sigma}(P)}{|W_uV_d|}$$

Figure 5:
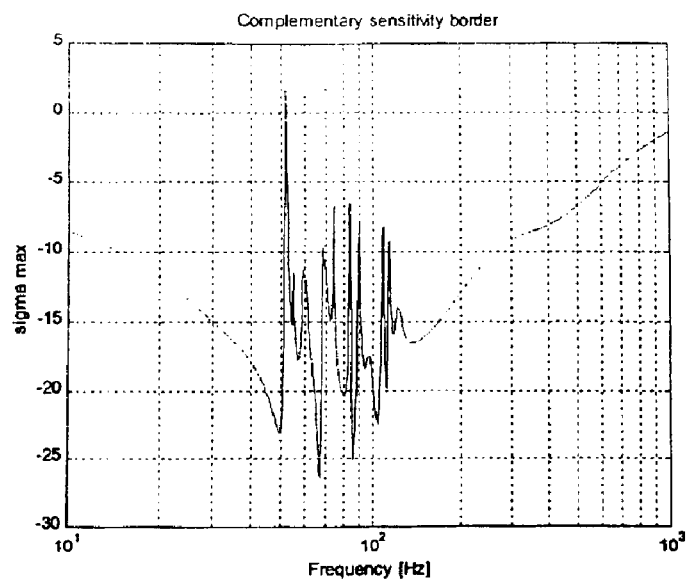
FIG. 5 depicts a T border plot according to an aspect of the invention.

FIG. 5 shows the border for the maximum singular value of T when $|W_uV_d|$ is chosen as drawn in FIG. 4. It can be seen that the border in the bode magnitude plot for this value T is very low, so T has to have a very small value at all frequencies to guarantee robust stability. Because of the rule S+T=1, I will approximately have the size of S, which means that a controller designed in this way will lead to near-zero performance improvement. The design and simulation of a controller with the mentioned weighting filters $W_u$ and $V_d$ confirmed this result.

As a consequence of the mentioned problem, we omit the guarantee of robust performance. This omission does not have to be disastrous, because the restriction that the H∞method imposes on the controller design to guarantee robustness often is far more stringent than needed. Therefore, the only restriction left will be the performance of the designed controller. The filter $W_u$ is employed to restrict R, but far above the robustness requirement.

Figure 6:
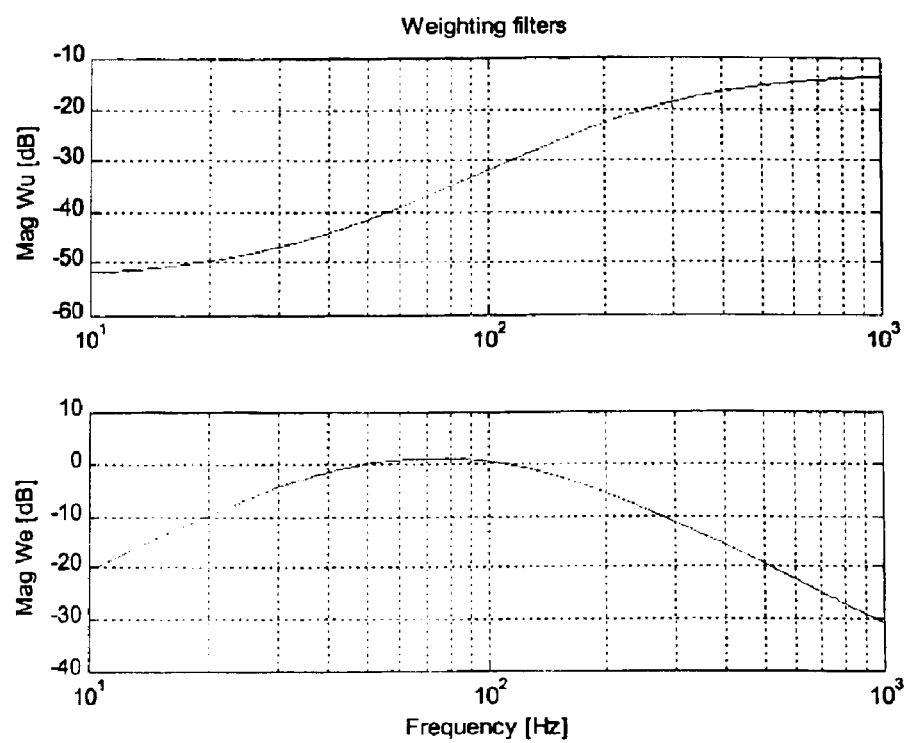
FIG. 6 depicts two weighting filter plots according to an aspect of the invention.

A first tuned H∞controller was developed with the disturbance taken as white noise, where $V_d$=1. The filters $W_e$ and $W_u$ are plotted in FIG. 6, and the transfer functions are:

$$We = 2.9\cdot 10^{-4}\cdot \left(\frac{(s+2\cdot \pi \cdot f_{e1})^2\cdot (s+2\cdot \pi \cdot f_{e2})^2}{(s+2\cdot \pi \cdot f_{e3})^2\cdot (s+2\cdot \pi \cdot f_{e4})^2}\right)$$

$$Wu = 0.23\cdot \left(\frac{(s+2\cdot \pi \cdot f_{u1})^2}{(s+2\cdot \pi \cdot f_{u3})^2}\right)$$

Figure 7:
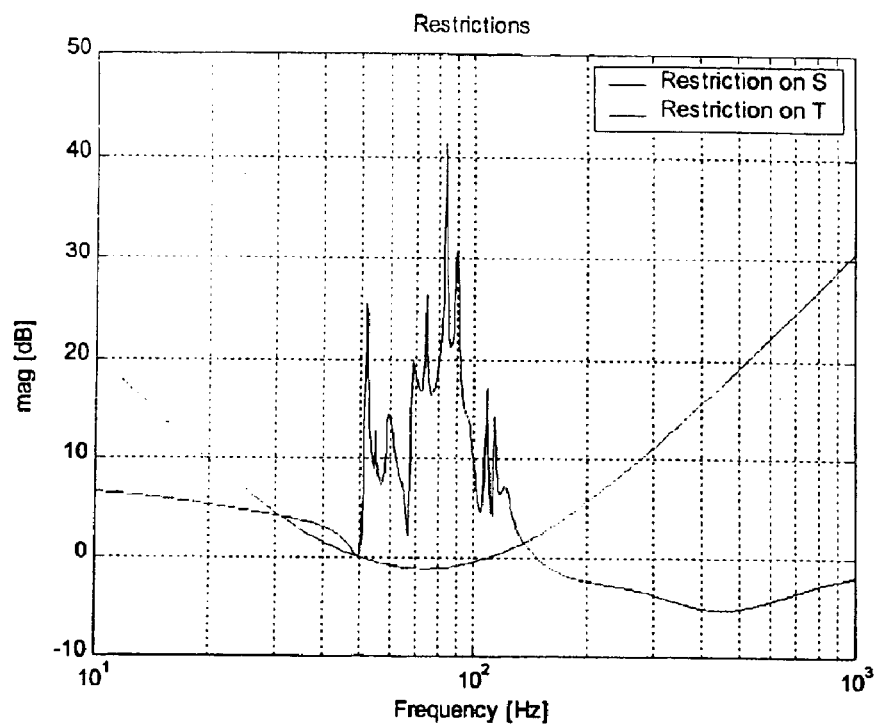
FIG. 7 depicts a sensitivity border plot according to an aspect of the invention.

$f_{e1}$=1 Hz, $f_{e2}$=1·10$^4$ Hz, $f_{e3}$=50 Hz, $f_{e4}$=110 Hz
$f_{u1}$=30 Hz, $f_{u2}$=300 Hz $W_u$ was chosen to follow the shape of the model uncertainty in the frequency domain, except for the peak. $W_e$ was chosen to emphasize the performance requirement in the range 50–110 Hz. The restrictions imposed on S and T by these filters can be seen in FIG. 7.

Figure 8:
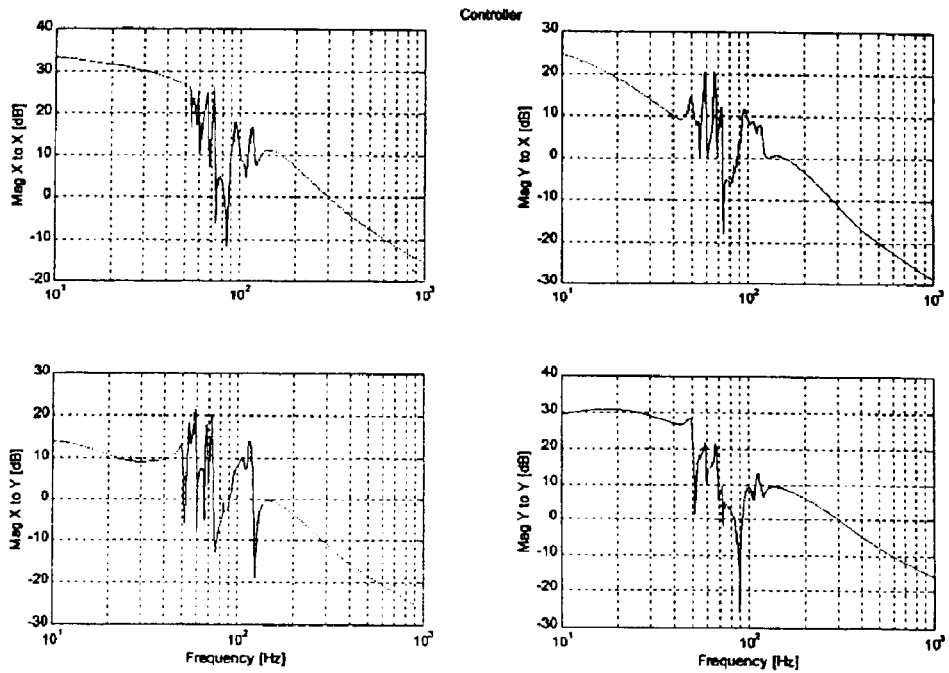
FIG. 8 depicts four controller plots according to an aspect of the invention.
Figure 9:
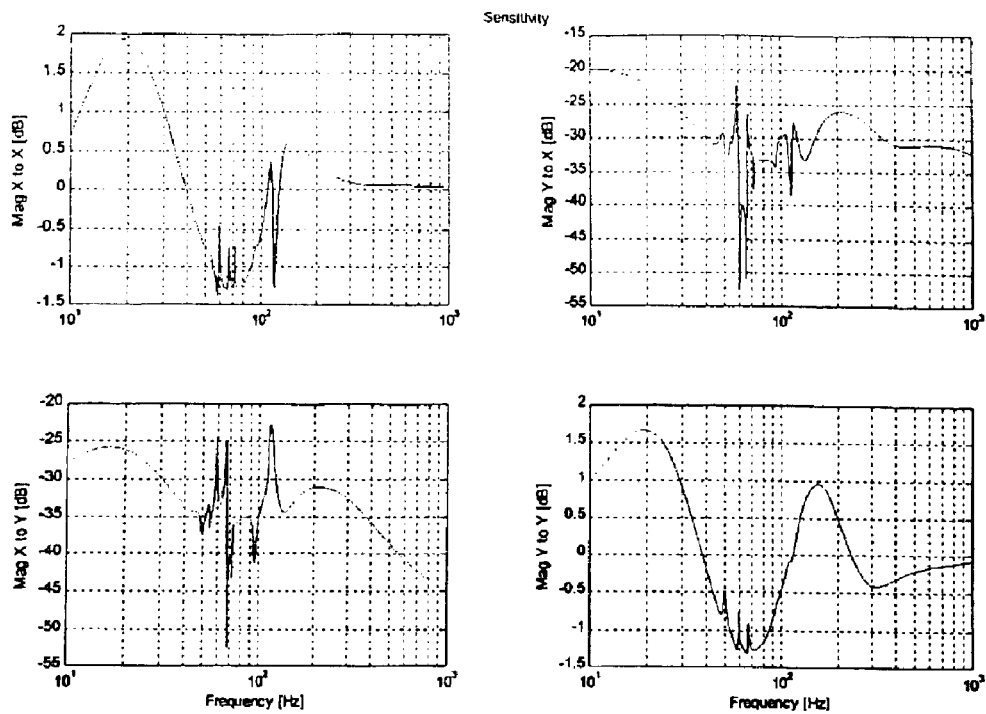
FIG. 9 depicts four sensitivity plots according to an aspect of the invention.

FIG. 8 shows the controller that emerged from this design. The achieved γ-value was 1.11. It can be seen that the controller actions are quite low. The sensitivity plot in FIG. 9 shows that the controller indeed emphasizes to improve the performance in the area 50–110 Hz. However, because white noise was taken as input for the disturbance input filter $V_d$, there is no extra emphasis in suppressing certain resonance frequencies. As a result, the controller wants to improve the performance over a wide area. Because of the explained strong trade-off between performance improvement and deterioration, the obtained performance improvement is very minimal. Furthermore the required sensitivity decrease at the non-minimum phase zero locations can not be complied with.

Figure 10:
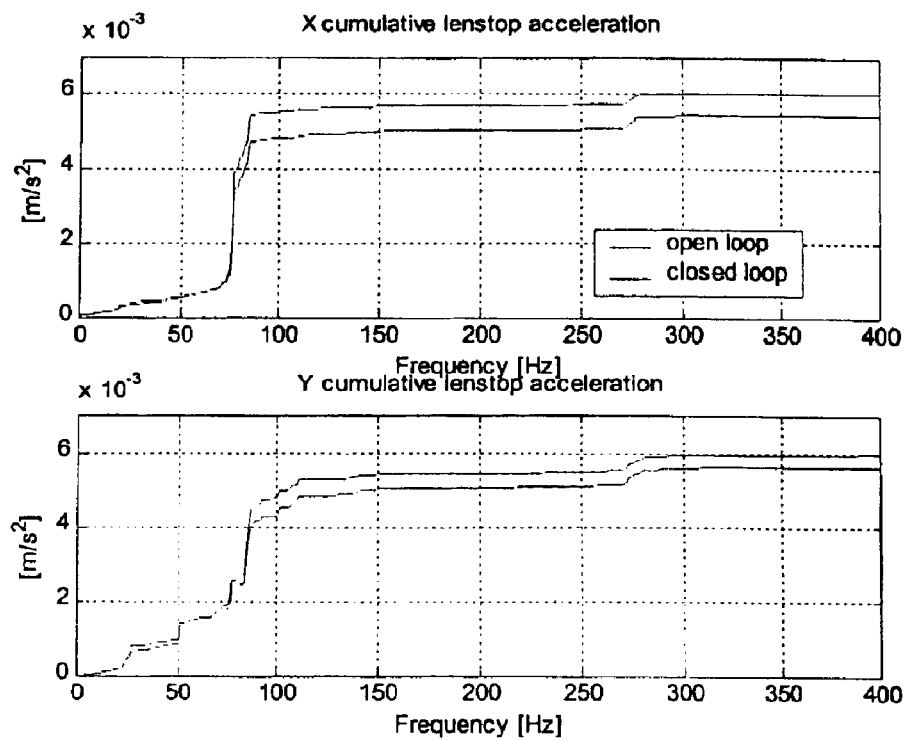
FIG. 10 depicts two cumulative PSD plots according to an aspect of the invention.

This controller was the best controller obtained with the filter $V_d$=1. It will not be analyzed further, because of its very minimal performance (9% and 8% RMS improvement, respectively, for X and Y, where RMS is the root mean square value of the measured lenstop acceleration). This performance may also be seen in FIG. 10, a cumulative PSD plot of a simulation (where a PSD plot is a plot of the power spectrum density of the measured lenstop acceleration). With this choice of filter shape, a trade-off between performance inside and outside the 50–110 Hz area was also possible, and again a conservative approach was taken. Furthermore, the performance improvement fluctuates little over the tracefiles, because of the lack of sharp peaks and narrow drops in the sensitivity.

The best way to precisely model the disturbance with a filter is to fit a filter exactly over the PSD of the measured disturbance data. First, phase data is generated, because only magnitude data is available in a PSD function.

Figure 11:
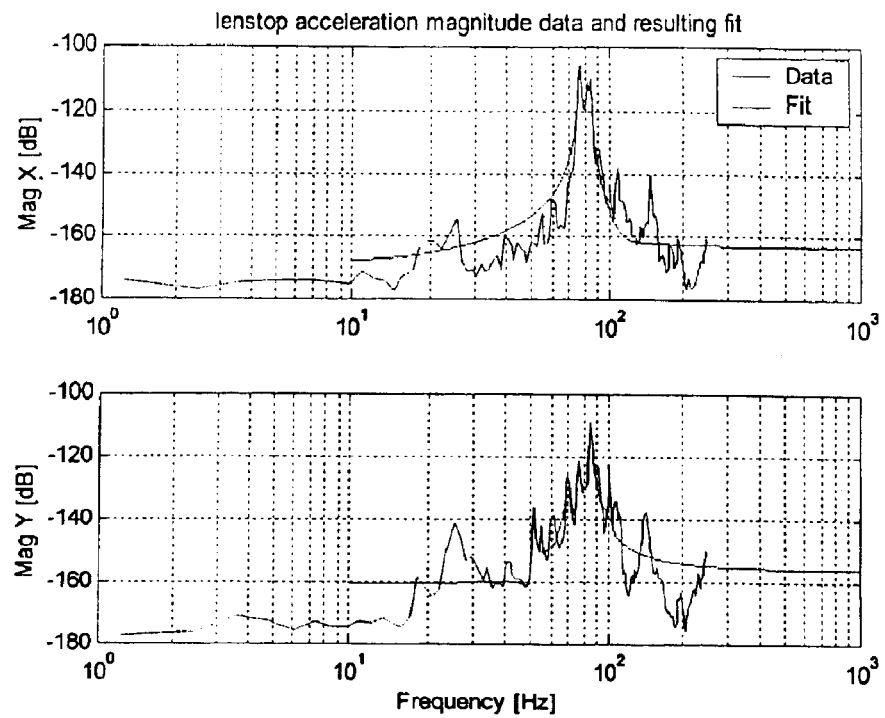
FIG. 11 depicts two plots of lenstop disturbance and $V_d$-fits according to an aspect of the invention.

An important remark at this point is that H∞design (before possible order reduction) leads to a controller that is of the order of the process (40 in this case) plus the order of all the filters. Consequently, a higher-order fit on the disturbance PSD-s will lead to a higher-order controller. This effect is one reason to confine the fit to a few orders. Furthermore this filter will not be diagonal, because the disturbance PSD in the x-direction differs from the disturbance PSD in the y-direction. Fits can be seen in FIG. 11, where $V_{dx}$ was 6$^{th}$ order and $V_{dy}$ was 12$^{th}$ order.

There was no success in designing a usable controller in this way. In nearly all cases, γ-values exceeded 100, also with the most conservative controller design (i.e. very low performance weights). The reason for this result appears to be numerical. When the 6$^{th}$-order $V_{dx}$ and the 12$^{th}$-order $V_{dy}$ filter are used, the function hinfsyn (e.g. as implemented in MATLAB or octave) is not capable of calculating controllers with a γ-value below 1000, regardless of the $W_e$ and $W_u$ filters, even when the restrictions on performance are very low. Decreasing $W_e$ and $W_u$ does not reduce the obtained γ-value. When the order of the $V_d$ filters is reduced, the γ-value that can be obtained does decrease. However, keeping $V_d$ of the order that is needed to approximate the disturbance PSD-s very roughly did not produce a γ-value near 1 and a well-performing controller.

Figure 12:
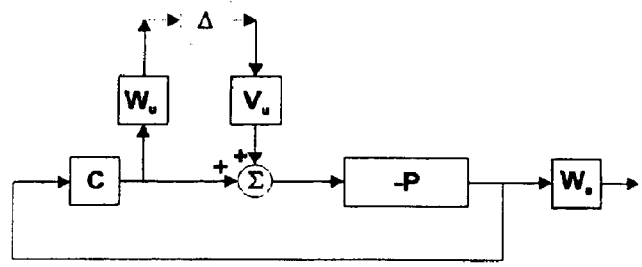
FIG. 12 depicts a third control loop according to an embodiment of the invention.
Figure 13:
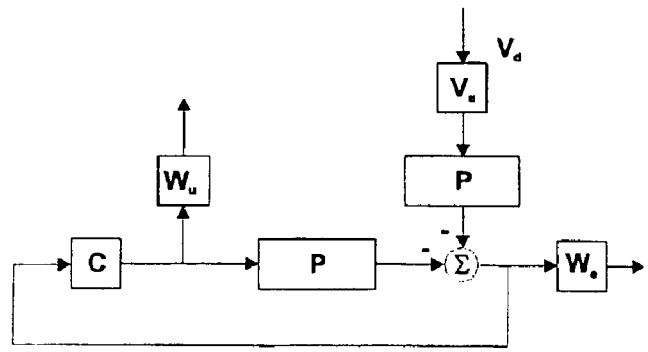
FIG. 13 depicts an alternative notation of the third control loop.

An alternative augmented plant is now described. This plant takes the disturbance information into account. In doing so, it is preferable to prevent the use of high-order filters, which may be done by composing the augmented plant as depicted in FIG. 12. It can be seen in this figure that the $V_d$ filter is left out and that an actuation input filter $V_u$ has come in its place. The augmented plant now can be compared with the plant that is depicted in FIG. 13.

When the filter $V_u$ is taken as a constant value, the disturbance is shaped with the great difference that a high-order filter is not needed. Although the disturbance has much resemblance with the process, however, the disturbance may not be modeled exactly, and this approach may produce a decrease of the process sensitivity P*S.

The H∞optimization problem again becomes a kind of mixed sensitivity problem to minimize:

$$\|M\|_\infty = \left\| \begin{pmatrix} W_e P \cdot SV_u \\ W_u T V_u \end{pmatrix} \right\|_\infty$$

The $V_u$ filter will be taken simply as I, and design restrictions will only be applied with the other two filters, $W_u$ and $W_e$. Restrictions on T and S can be deducted equivalently to the deduction of the restrictions at the previous augmented plant setup and when aimed at $\|M\|_\infty < \gamma \approx 1$, they become:

$$\forall \omega : \overline{\sigma}(S) < \frac{1}{|W_e V_u| \underline{\sigma}(P)}$$

$$\forall \omega : \overline{\sigma}(T) < \frac{1}{|W_u V_u|}$$

Figure 14:
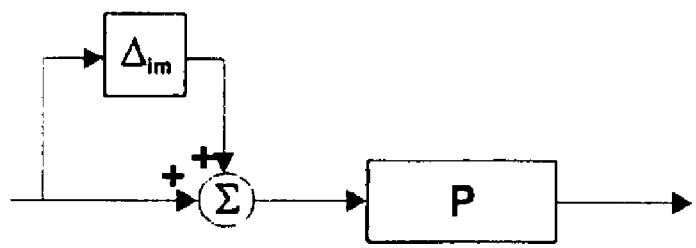
FIG. 14 depicts a multiplicative uncertainty loop according to an aspect of the invention.

$W_u$ will be used to model the model uncertainty. Because of the different structure of the augmented plant, in this case the modeling of the uncertainty is done with input multiplicative model uncertainty, as depicted in FIG. 14.

As a result of the small gain theorem, robust stability is assured when $$\forall \omega : \overline{\sigma}(T) \cdot \overline{\sigma}(\Delta_{im}) < 1 \iff \forall \omega : \overline{\sigma}\left(W_u T V_u \cdot \frac{1}{W_u V_u}\right) \cdot \overline{\sigma}(\Delta_{im}) < 1,$$

and because $$\|M\|_\infty < \gamma \approx 1 \Rightarrow \|W_u T V_u\|_\infty < 1 \iff \forall \omega : \overline{\sigma}(W_u T V_u) < 1 \Rightarrow$$

$$\overline{\sigma}\left(W_u T V_u \cdot \frac{1}{W_u V_u}\right) \leq \overline{\sigma}(W_u T V_u) \cdot \frac{1}{|W_u V_u|} < \frac{1}{|W_u V_u|}$$

a sufficient condition for robust stability is $$\frac{1}{|W_u V_u|} \overline{\sigma}(\Delta_{im}) < 1 \iff \overline{\sigma}(\Delta_{im}) < |W_u V_u|.$$

The weighting filters can be chosen so that $|W_u V_u|$ meets this condition. While we can use $W_u$ to model model uncertainty and guarantee robust stability, however, it may not be possible to reach this guarantee when also requiring performance.

This configuration of the augmented plant turned out to be very convenient to work with and the performance of the controllers designed in this way was often acceptable. A total trade-off was possible between the performance inside and outside the 50–110 Hz frequency area.

Figure 15:
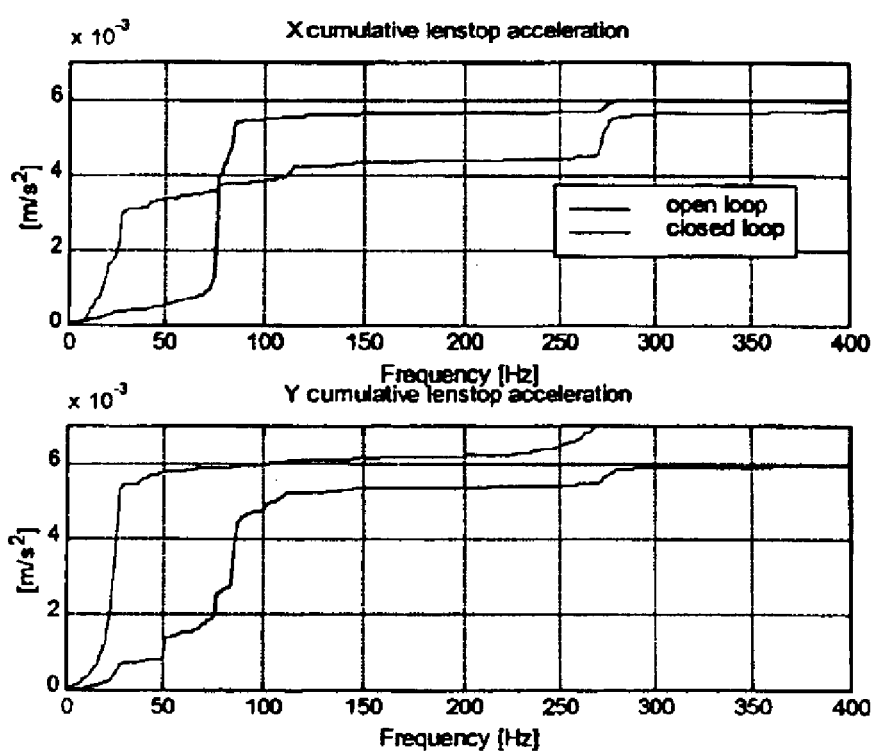
FIG. 15 depicts two total performance trade-off plots according to an aspect of the invention.

FIG. 15 shows what is meant with this total trade-off. This figure displays the cumulative PSD-s resulting from a simulation that was calculated to obtain a controller that performed very well in the area 50–110 Hz. It can be seen that this result is obtained at the cost of performance at frequencies outside this area.

Figure 16:
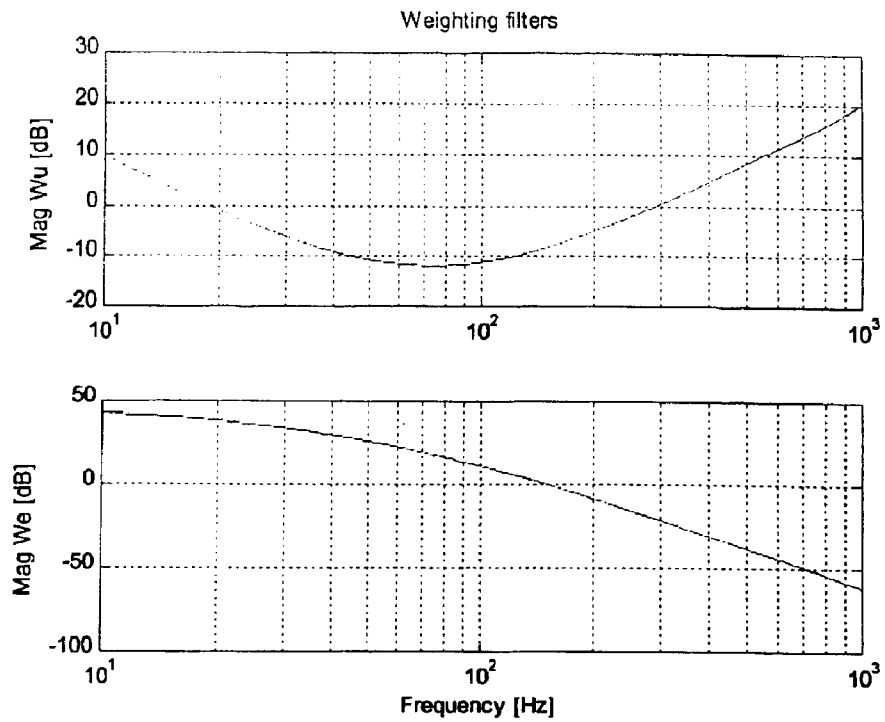
FIG. 16 depicts two weighting filter plots according to an aspect of the invention.

After tuning the controller, the best performance requirements were obtained with the filters denoted below and plotted in FIG. 16.

$$W_e = 8.38 \cdot 10^{-8} \cdot \left( \frac{(s + 2 \cdot \pi \cdot f_{e1})^4}{(s + 2 \cdot \pi \cdot f_{e2})^2 \cdot (s + 2 \cdot \pi \cdot f_{e3})^2} \right)$$

$$W_u = 1000 \cdot \left( \frac{(s + 2 \cdot \pi \cdot f_{u1})^2 \cdot (s + 2 \cdot \pi \cdot f_{u2})^2}{(s + 2 \cdot \pi \cdot f_{u3})^2 \cdot (s + 2 \cdot \pi \cdot f_{u4})^2} \right)$$

Figure 17:
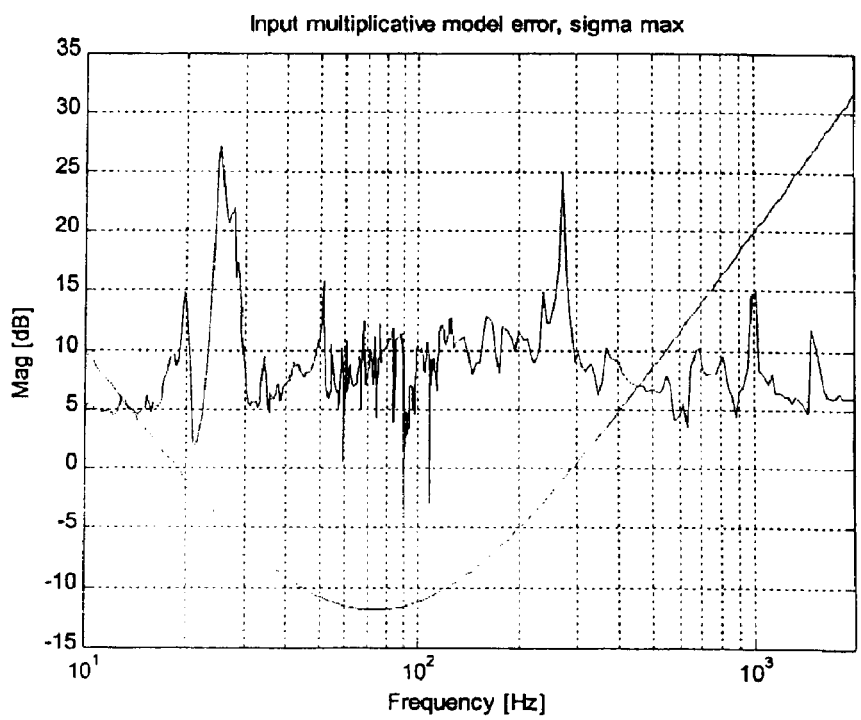
FIG. 17 depicts a multiplicative model error plot according to an aspect of the invention.

$f_{e1}=1 \cdot 10^4$ Hz, $f_{e2}=20$ Hz, $f_{e3}=110$ Hz
$f_{u1}=50$ Hz, $f_{u2}=110$ Hz, $f_{u3}=1$ Hz, $f_{u4}=10000$ Hz The mean performance improvement concerning RMS-values with this controller was 46% in X direction and 24% in Y-direction, which is rather well compared with previous designed controllers. Again, these results were obtained without a guarantee of robust stability. The input multiplicative model uncertainty was calculated and plotted in FIG. 17, with the modeled model uncertainty plotted in the same figure.

Figure 18:
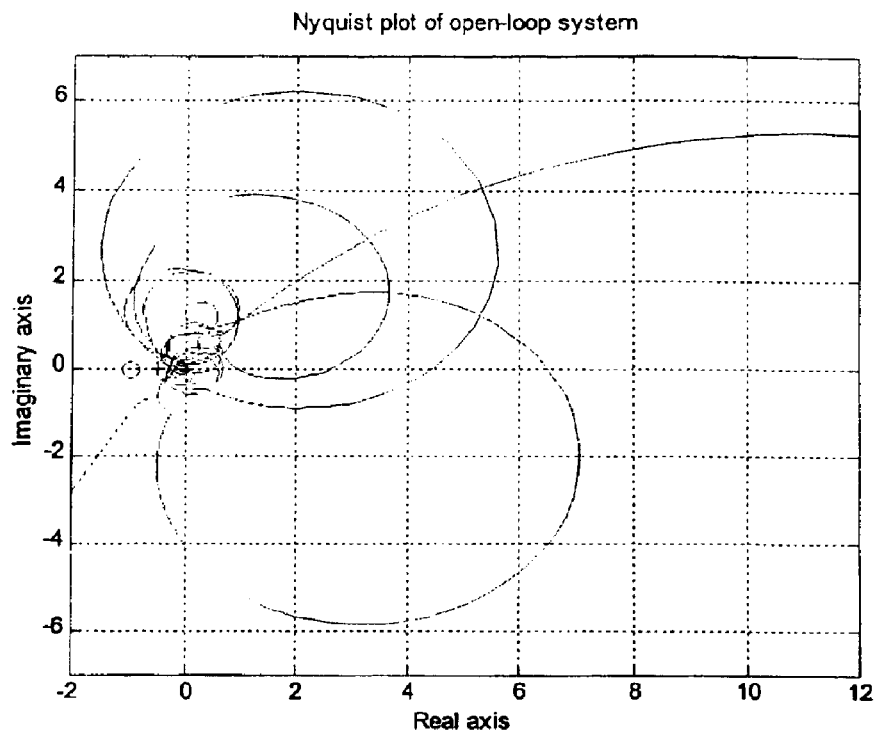
FIG. 18 depicts a modeled Nyquist plot according to an aspect of the invention.
Figure 19:
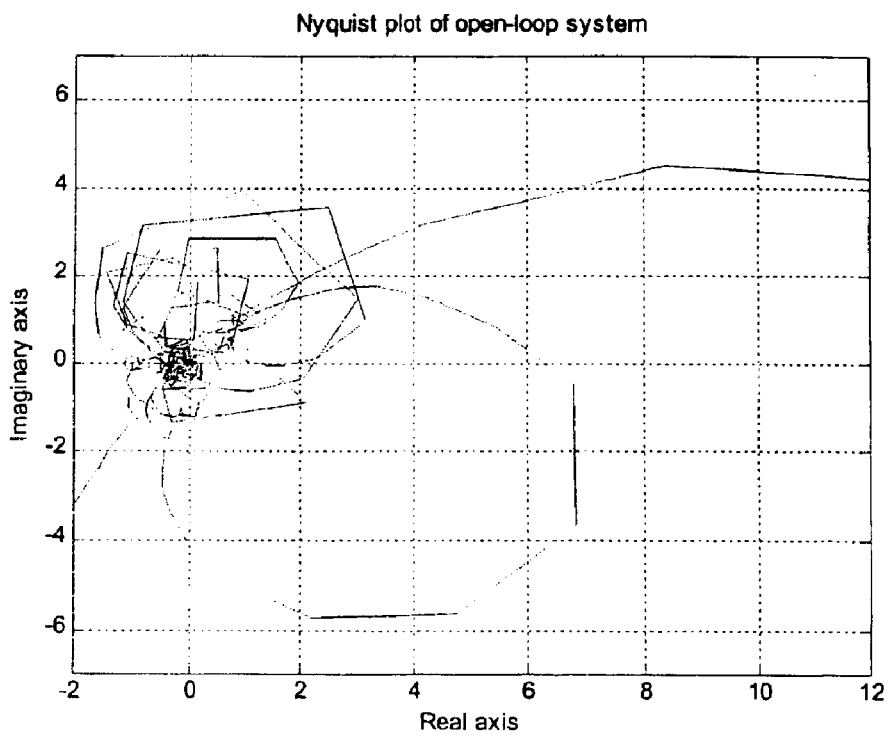
FIG. 19 depicts a measured Nyquist plot according to an aspect of the invention.

It turned out that, contrary to designed controllers in previous sections, evaluation of this controller with the measured transfer functions revealed an unstable closed-loop, as can be seen in the Nyquist plots in FIGS. 18 and 19. The Nyquist plot of the modeled system does not encircle the point −1, while the plot with the measured system does encircle this point. It was found that the difference between the modeled and measured systems leads to an unstable loop with almost any controller that performed rather well, but that was designed with this augmented plant structure. In other words, omitting the robustness guarantee and designing a controller with the augmented plant structure of FIG. 12 produced a controller that is not robust enough. The reason for this is that with the mixed sensitivity problem, pole/zero cancellations are likely to occur, which leads to this low robustness. Studying pole-zero maps confirmed that this is the case.

Figure 20:
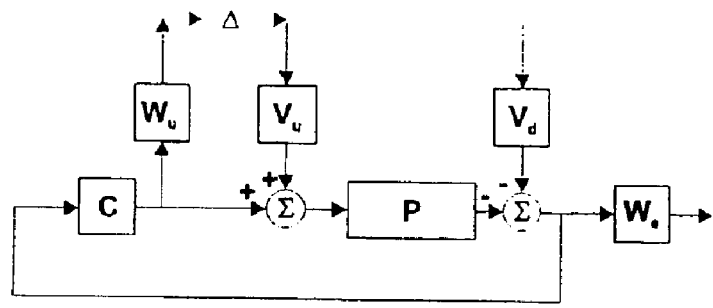
FIG. 20 depicts a fourth control loop according to an embodiment of the invention.

The robustness is improved in another embodiment as described below. At this moment we will leave the principle of keeping the composed matrix M resulting from the augmented plant as small as possible. Pole/zero cancellations are less likely to occur in the so-called four-block problem, and therefore the solution of that problem inherently introduces robustness. This four-block problem is obtained when the two previous proposed augmented plants are combined, i.e. when the augmented plant contains both an actuation input filter and a disturbance input filter. A diagram of such an augmented plant is shown in FIG. 20. In this example, the model uncertainty is modeled with input multiplicative uncertainty. The model uncertainty will not be discussed any further.

The four-block problem is to minimize $$\|M\|_\infty = \left\|\begin{pmatrix} W_e S V_d & W_e P \cdot S V_u \\ W_u R V_d & W_u T V_u \end{pmatrix}\right\|_\infty .$$

Instead of one restriction on S and one restriction on T, still aiming at $\|M\|\infty<\gamma\approx 1$ leads to two restrictions for S and two for T. This condition leads to the opportunity to use low-order filters to stress performance at certain frequencies while still fairly restricting the sensitivity at other frequencies.

By shaping and tuning of the filters until an optimal performance was reached, the following filters were obtained:

$Vd=4.54\cdot 10^{-2}$ $Vu=1$ $$We = 2.69\cdot 10^{-3}\cdot\left(\frac{(s+2\cdot\pi\cdot f_{e1})^2(s+2\cdot\pi\cdot f_{e2})^2}{(s+2\cdot\pi\cdot f_{e3})^2\cdot(s+2\cdot\pi\cdot f_{e4})^2}\right)$$

$$Wu = 2250\cdot\left(\frac{(s+2\cdot\pi\cdot f_{u1})^2\cdot(s+2\cdot\pi\cdot f_{u2})^2}{(s+2\cdot\pi\cdot f_{u3})^2\cdot(s+2\cdot\pi\cdot f_{u4})^2}\right)$$

Figure 21:
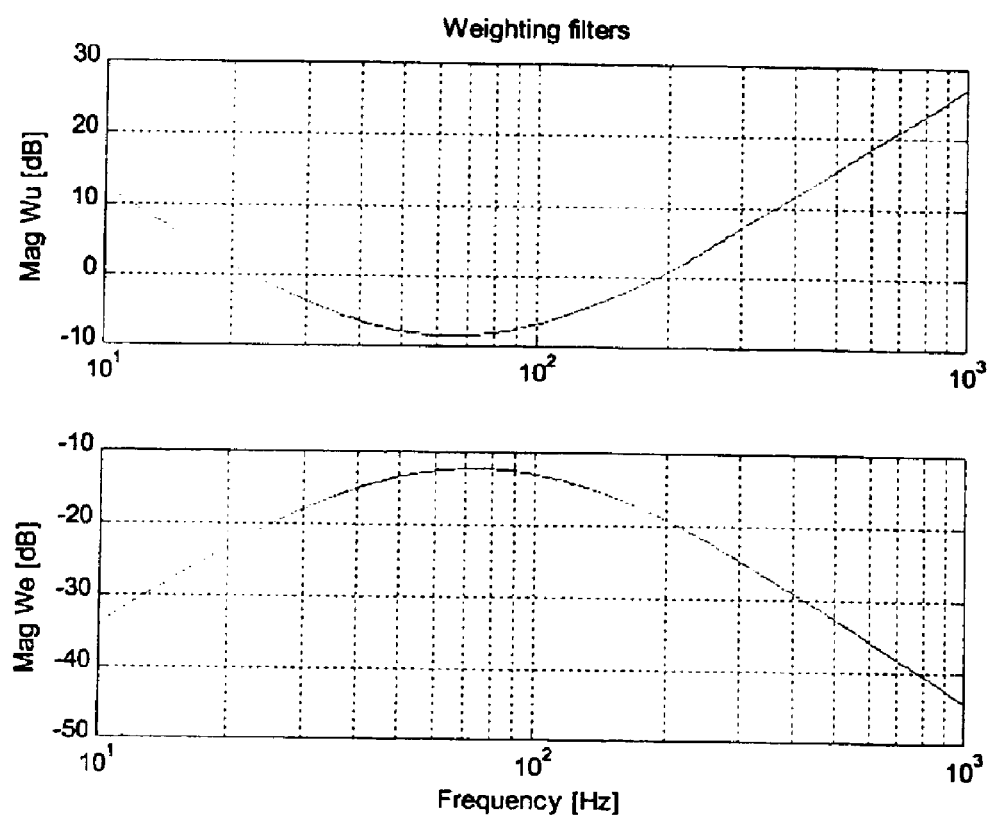
FIG. 21 depicts two weighting filter plots according to an aspect of the invention.
Figure 22:
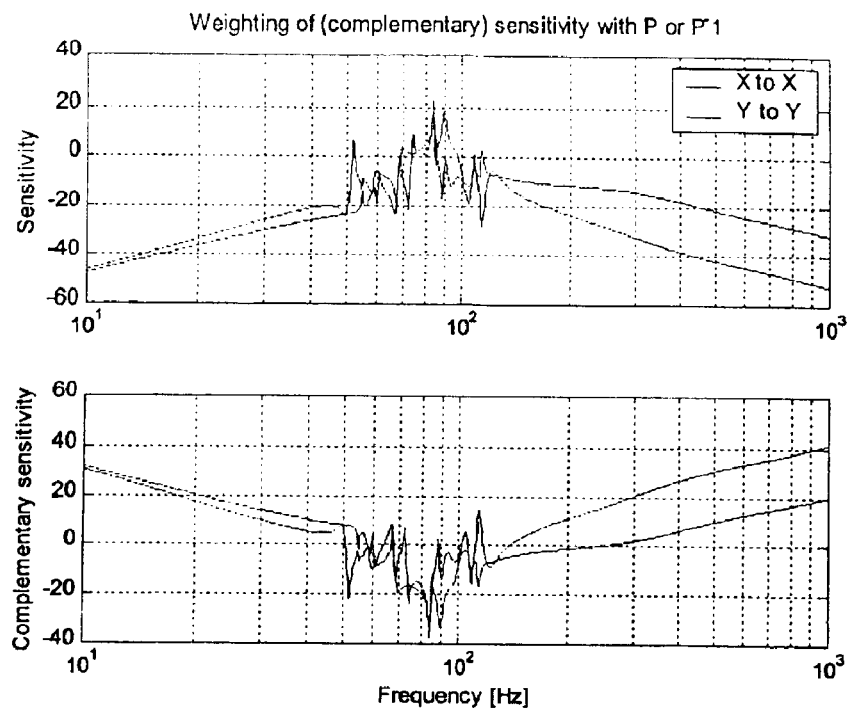
FIG. 22 depicts two sensitivity plots according to an aspect of the invention.
Figure 23:
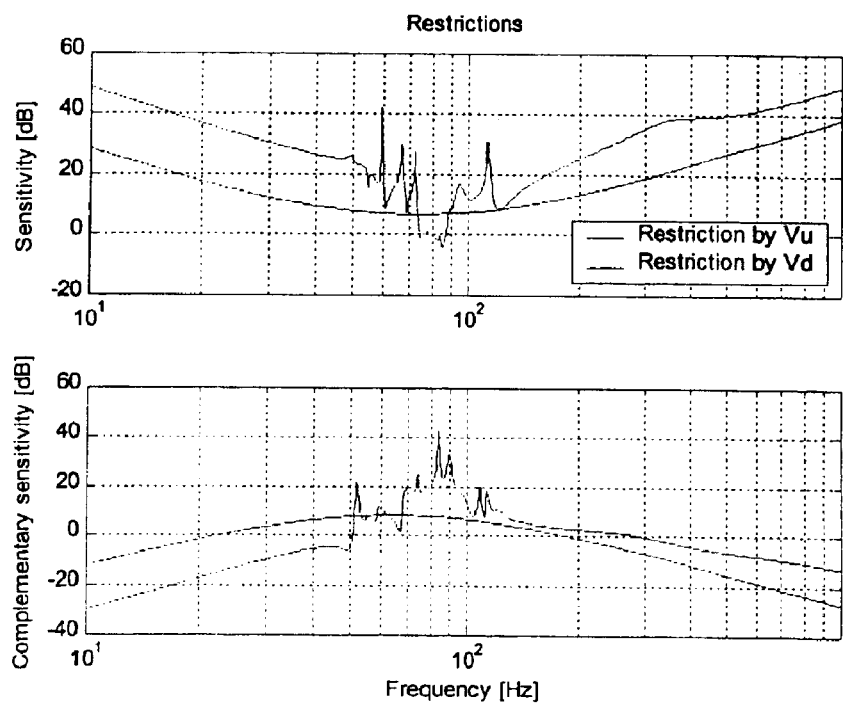
FIG. 23 depicts two sensitivity plots according to an aspect of the invention.

$f_{e1}=1$ Hz, $f_{e2}=1\cdot 10^4$ Hz, $f_{e3}=50$ Hz, $f_{e4}=110$ Hz $f_{u1}=60$ Hz, $f_{u2}=70$ Hz, $f_{u3}=1$ Hz, $f_{u4}=10000$ Hz A plot of the filters $W_e$ and $W_u$ above can be seen in FIG. 21. FIG. 22 shows the weighting on S and T for the X to X and the Y to Y directions by $|W_e P_i V_u|$ and $|W_u P_i^{-1} V_d|$, respectively, where for $P_i$ the values of $P_{11}$ and $P_{22}$, respectively, were taken this way, it is possible to see where extra performance improvement is requested for the X to X and Y to Y directions. FIG. 23 shows the restrictions that are made on S and T. It can be noticed that although extra performance improvement at resonance frequencies is still required, compliance with this condition at the cost of excessive performance deterioration at other frequencies is not permitted.

Figure 24:
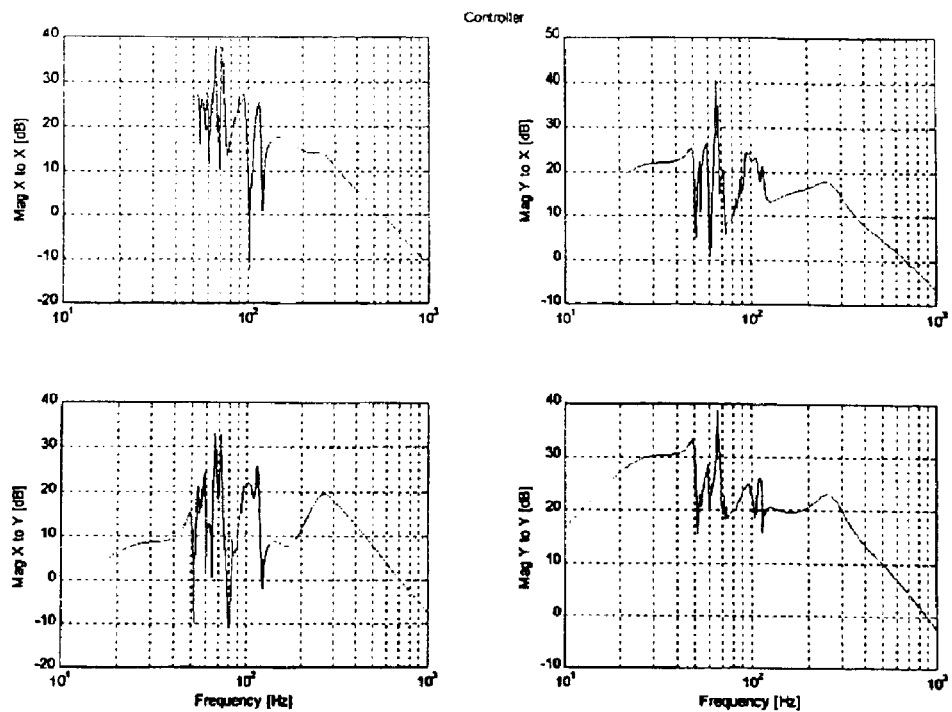
FIG. 24 depicts four controller plots according to an aspect of the invention.
Figure 25:
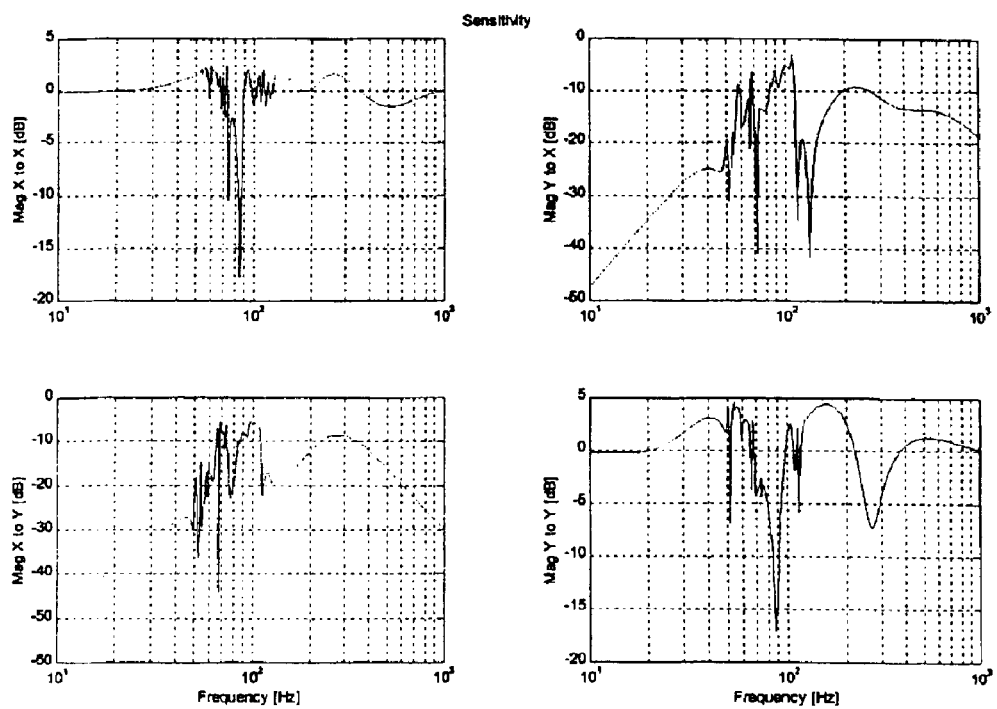
FIG. 25 depicts four sensitivity plots according to an aspect of the invention.
Figure 26:
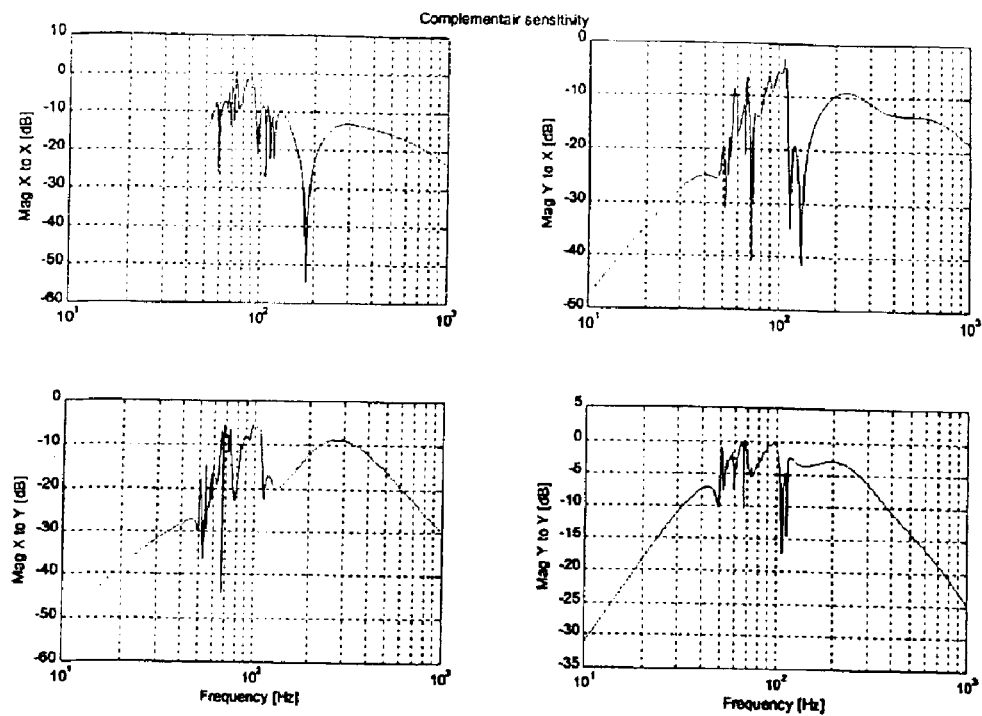
FIG. 26 depicts four complementary sensitivity plots according to an aspect of the invention.
Figure 27:
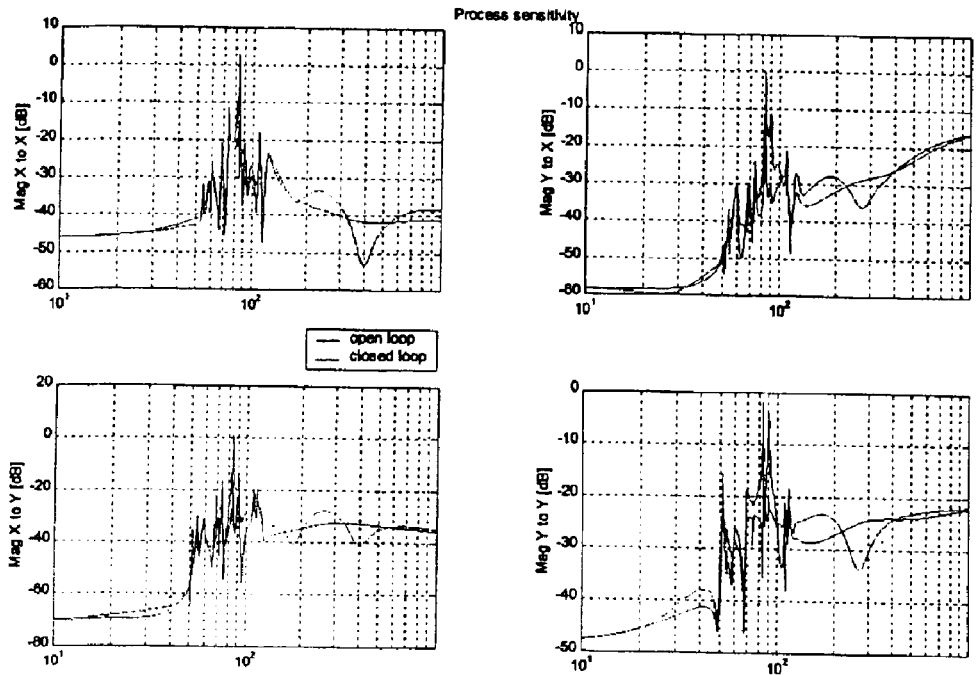
FIG. 27 depicts four process sensitivity plots according to an aspect of the invention.

The designed controller can be seen in FIG. 24, the sensitivity in FIG. 25, the complementary sensitivity in FIG. 26, and the process sensitivity in FIG. 27. The obtained γ-value was 0.98. The complementary sensitivity plot shows that neglecting the sensor noise did not lead to an unacceptable complementary sensitivity, and therefore this feature was allowed. The actuation signal does not exceed 0.2 V and does not have components below 5 Hz. The process sensitivity plot shows that indeed the controller emphasizes suppression of the resonance peaks.

Figure 28:
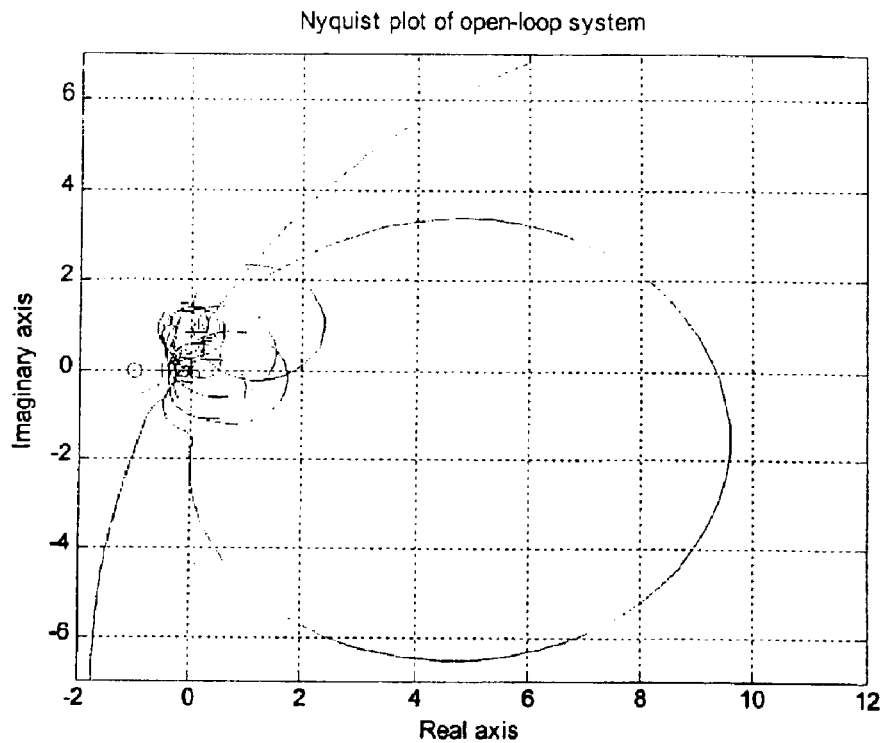
FIG. 28 depicts a modeled Nyquist plot according to an aspect of the invention.
Figure 29:
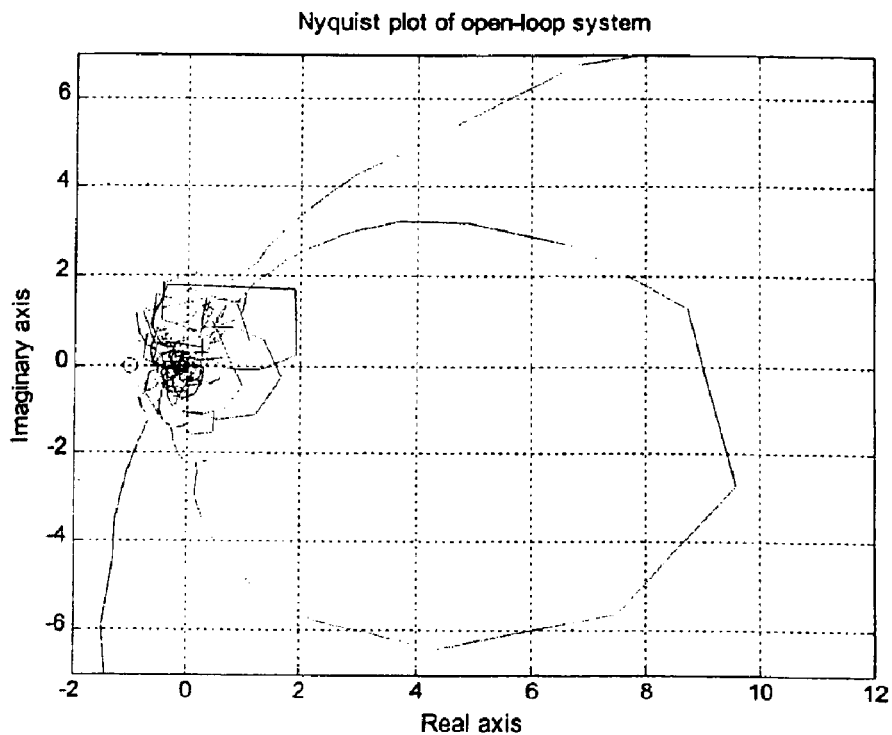
FIG. 29 depicts a measured Nyquist plot according to an aspect of the invention.

FIG. 28 shows a MIMO Nyquist plot of the modeled open-loop, and FIG. 29 shows a Nyquist plot of the measured open-loop. It can be seen that the system indeed is stable. With this augmented plant setup, it was far easier to trade off between robustness and performance.

Figure 30:
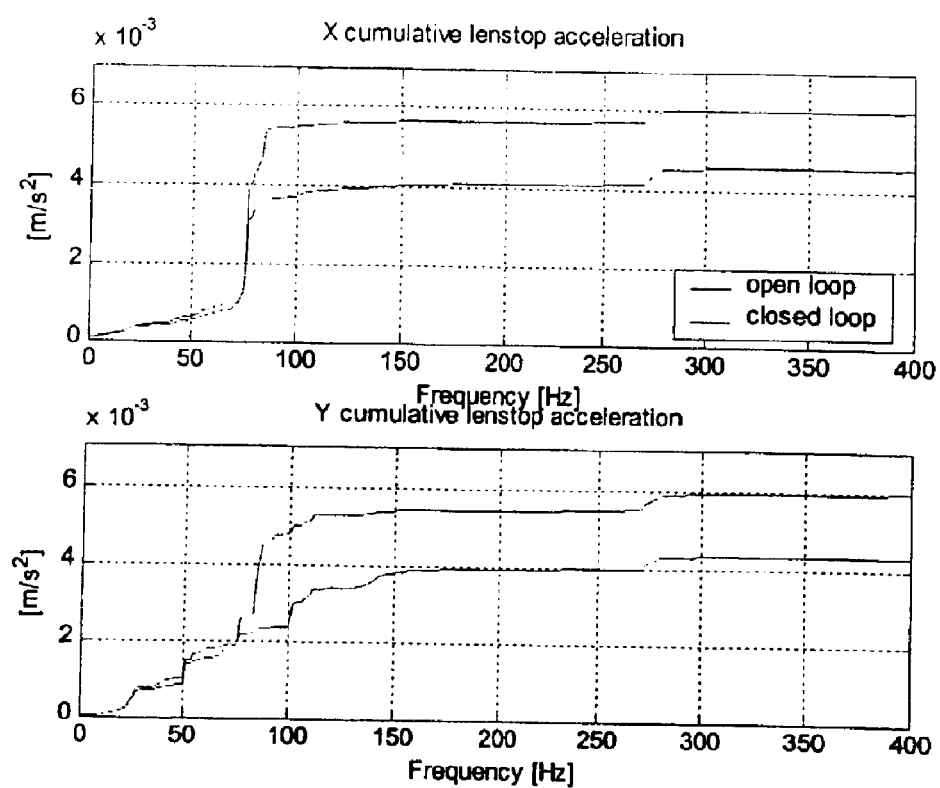
FIG. 30 depicts two simulated cumulative PSD plots according to an aspect of the invention.

FIG. 30 shows the cumulative PSD that resulted from a simulation with this controller. The mean performance improvement concerning RMS values obtained with this controller were 32% in x-direction and 33% in y-direction.

Whilst specific embodiments of the invention have been described above, it will be appreciated that the invention as claimed below may be practiced otherwise than as described. It is explicitly noted that the description of these embodiments is not intended to limit the invention as claimed.

With respect to the apparatus claims recited below, one who makes, imports, offers to sell, sells, or otherwise transfers an apparatus that has the elements recited in such a claim, including elements that are configured to perform a recited act (e.g. have a structure sufficient to perform such act) and are arranged to perform such act (e.g. with respect to one or more other elements of the apparatus), shall be deemed to infringe such claim. The infringement of such claim shall be complete by virtue of the claim reading on the structure of the apparatus, regardless of and apart from any use of that apparatus.

We claim:

1. A lithographic projection apparatus configured to image a pattern onto a substrate, said apparatus comprising:
   a radiation system configured to provide a beam of radiation;
   a support structure configured to support a patterning structure capable of patterning the beam according to a desired pattern;
   a substrate table configured to hold the substrate;
   a projection system mounted on a main plate and configured to project the patterned beam onto a target portion of the substrate; and
   a control system including:
      a movement detector configured to detect movement of the projection system relative to the main plate and to generate a movement signal based on said detected movement;
      a controller configured to generate a control signal in response to said movement signal; and
      an actuator assembly configured to affect, in response to said control signal, the movement of the projection system.

2. The lithographic projection apparatus according to claim 1, wherein said control system is configured to dampen vibration of the projection system.

3. The lithographic projection apparatus according to claim 2, wherein said control system is configured to suppress a resonance peak of the projection system.

4. The lithographic projection apparatus according to claim 2, wherein said control system is configured to dampen vibration between 50 and 110 Hz.

5. The lithographic projection apparatus according to claim 1, wherein said movement detector includes at least one accelerometer.

6. The lithographic projection apparatus according to claim 5, wherein said movement detector includes a first accelerometer configured to measure acceleration in a first direction, and a second accelerometer configured to measure acceleration in a second direction orthogonal to the first direction.

7. The lithographic projection apparatus according to claim 1, wherein said movement detector includes at least one geophone.

8. The lithographic projection apparatus according to claim 1, wherein said movement detector includes at least one piezo element.

9. The lithographic projection apparatus according to claim 1, wherein said actuator assembly is positioned between said projection system and the main plate, and
   wherein said actuator assembly is configured to move said projection system relative to the main plate.

10. The lithographic projection apparatus according to claim 9, wherein said actuator assembly includes a piezo element.

11. The lithographic projection apparatus according to claim 1, wherein said actuator assembly is connected to the main plate.

12. The lithographic projection apparatus according to claim 11, wherein said actuator assembly includes an air mount.

13. The lithographic projection apparatus according to claim 11, wherein said actuator assembly includes a Lorentz-force motor.

14. The lithographic projection apparatus according to claim 1, wherein the controller is configured to generate the control signal according to an H-infinity-based control algorithm.

15. The lithographic projection apparatus according to claim 1, wherein the projection system is configured to project the patterned beam along an optical axis, and
wherein the actuator assembly is configured to affect, in response to said control signal, a movement of the projection system in a direction perpendicular to the optical axis.

16. A lithographic projection apparatus configured to image a pattern onto a substrate, said apparatus comprising:
a radiation system configured to provide a beam of radiation;
a support structure configured to support a patterning structure capable of patterning the beam according to a desired pattern;
a substrate table configured to hold the substrate;
a projection system mounted on a main plate and configured to project the patterned beam onto a target portion of the substrate; and
a control system configured to actively affect a disturbance movement of the projection system relative to the main plate during projection of the patterned beam.

17. A lithographic projection apparatus according to claim 16, wherein said control system is configured to dampen vibration of the projection system.

18. A lithographic projection apparatus according to claim 17, wherein said control system is configured to suppress a resonance peak of the projection system.

19. A lithographic projection apparatus according to claim 16, wherein said control system is configured to dampen vibration between 50 and 110 Hz.

20. A lithographic projection apparatus according to claim 16, wherein said control system comprises a movement detector configured to detect movement of the projection system.

21. A lithographic projection apparatus according to claim 20, wherein said movement detector includes at least one accelerometer.

22. A lithographic projection apparatus according to claim 21, wherein said movement detector includes a first accelerometer configured to measure acceleration in a first direction, and a second accelerometer configured to measure acceleration in a second direction orthogonal to the first direction.

23. A lithographic projection apparatus according to claim 20, wherein said movement detector includes at least one geophone.

24. A lithographic projection apparatus according to claim 20, wherein said movement detector includes at least one piezo element.

25. A lithographic projection apparatus according to claim 16, wherein said control system comprises an actuator assembly that is positioned between the projection assembly and the main plate, and
wherein said actuator assembly is configured to move said projection system relative to the main plate.

26. A lithographic projection apparatus according to claim 25, wherein said actuator assembly includes a piezo element.

27. A lithographic projection apparatus according to claim 25, wherein said actuator assembly is connected to the main plate.

28. A lithographic projection apparatus according to claim 27, wherein said actuator assembly includes an airmount.

29. A lithographic projection apparatus according to claim 27, wherein said actuator assembly includes a Lorentz-force motor.

30. The lithographic projection apparatus according to claim 16, wherein the projection system is configured to project the patterned beam along an optical axis, and
wherein the actuator assembly is configured to actively affect movement of the projection system in a direction perpendicular to the optical axis.

31. A device manufacturing method, said method comprising:
endowing a beam of radiation with a pattern in its cross-section;
using a projection system mounted on a main plate, projecting the patterned beam of radiation onto a target portion of a layer of radiation-sensitive material that at least partially covers a substrate; and
actively controlling a disturbance movement of the projection system relative to the main plate during said projecting.

32. The device manufacturing method according to claim 31, wherein said actively controlling a movement of the projection system includes actively damping a vibration of the projection system.

33. The device manufacturing method according to claim 31, wherein said actively controlling a movement of the projection system includes actively reducing vibration of the projection system between 50 and 110 Hz.

34. The device manufacturing method according to claim 31, wherein said actively controlling a movement of the projection system includes actively suppressing a resonance peak of the projection system.

35. The device manufacturing method according to claim 31, wherein said actively controlling a movement of the projection system includes detecting movement of the projection system; generating a control signal based on the detected movement; and, in response to the control signal, affecting the movement of the projection system.

36. The device manufacturing method according to claim 31, wherein said actively controlling comprises actively controlling a movement of the projection system in a direction perpendicular to the optical axis.

* * * * *